(12) United States Patent
Li et al.

(10) Patent No.: US 8,487,706 B2
(45) Date of Patent: Jul. 16, 2013

(54) STACKED LINEAR POWER AMPLIFIER WITH CAPACITOR FEEDBACK AND RESISTOR ISOLATION

(75) Inventors: Yang Edward Li, Woburn, MA (US); Robert Broughton, Chester, NH (US); Peter Bacon, Derry, NH (US); James Bonkowski, Cary, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 252 days.

(21) Appl. No.: 12/657,728

(22) Filed: Jan. 25, 2010

(65) Prior Publication Data

US 2011/0181360 A1    Jul. 28, 2011

(51) Int. Cl.
*H03F 3/04*    (2006.01)

(52) U.S. Cl.
USPC .......................................... 330/311; 330/310

(58) Field of Classification Search
USPC .................... 330/311, 310, 150, 98
See application file for complete search history.

(56) References Cited

U.S. PATENT DOCUMENTS

| | | |
|---|---|---|
| 3,469,212 A | 9/1969 | Georg et al. |
| 4,528,517 A | 7/1985 | Schlotzhauer |
| 5,012,123 A | 4/1991 | Ayasli et al. |
| 5,331,221 A | 7/1994 | Ganesan et al. |
| 5,732,334 A | 3/1998 | Miyake |
| 6,111,462 A | 8/2000 | Mucenieks et al. |
| 6,137,367 A | 10/2000 | Ezzedine et al. |
| 6,242,979 B1 | 6/2001 | Li |
| 6,281,756 B1 | 8/2001 | Goto et al. |
| 6,366,172 B1 | 4/2002 | Hayashi et al. |
| 6,496,074 B1 | 12/2002 | Sowlati |
| 6,515,547 B2 | 2/2003 | Sowlati |
| 6,636,114 B2 | 10/2003 | Tsutsui et al. |
| 6,658,265 B1 | 12/2003 | Steel et al. |
| 6,731,175 B1 | 5/2004 | Chen |
| 6,853,244 B2 | 2/2005 | Robinson et al. |
| 6,853,247 B2 | 2/2005 | Weldon |
| 6,864,750 B2 | 3/2005 | Shigematsu |
| 6,943,628 B2 | 9/2005 | Weldon |
| 7,071,786 B2 | 7/2006 | Inoue et al. |
| 7,135,929 B1 | 11/2006 | Costa et al. |
| 7,161,429 B2 | 1/2007 | Boreysha et al. |
| 7,202,712 B2 | 4/2007 | Athas |
| 7,202,734 B1 | 4/2007 | Raab |
| 7,248,120 B2 | 7/2007 | Burgener et al. |
| 7,248,845 B2 | 7/2007 | Dunn |

(Continued)

OTHER PUBLICATIONS

Jeong, Jinho, et al., "A 20 dBm Linear RF Power Amplifier Using Stacked Silicon-on-Sapphire MOSFETs", IEEE Microwave and Wireless Components Letters,. vol. 16, No. 12, Dec. 2006, pp. 684-686.

(Continued)

*Primary Examiner* — Henry Choe
(74) *Attorney, Agent, or Firm* — Jaquez & Associates; Martin J. Jaquez, Esq.; Alessandro Steinfl, Esq.

(57) ABSTRACT

A power amplifier with stacked, serially connected, field effect transistors is described. DC control voltage inputs are fed to the gates of each transistor. Capacitors are coupled to the transistors. The inputs and the capacitors are controlled to minimize generation of non-linearities of each field effect transistor and/or to maximize cancellation of distortions between the field effect transistors of the power amplifier in order to improve linearity of the power amplifier output.

20 Claims, 7 Drawing Sheets

U.S. PATENT DOCUMENTS

| | | | |
|---|---|---|---|
| 7,276,976 | B2 | 10/2007 | Oh et al. |
| 7,352,247 | B2 | 4/2008 | Oh et al. |
| 7,391,269 | B2 | 6/2008 | Chiba |
| 7,457,594 | B2 | 11/2008 | Theobold et al. |
| 7,545,216 | B2 | 6/2009 | Harnley |
| 7,551,036 | B2 | 6/2009 | Berroth et al. |
| 7,586,376 | B2 | 9/2009 | Litmanen |
| 7,649,418 | B2 * | 1/2010 | Matsui .................. 330/284 |
| 7,714,662 | B2 * | 5/2010 | Jeong et al. ............ 330/302 |
| 7,786,807 | B1 | 8/2010 | Li et al. |
| 7,808,342 | B2 | 10/2010 | Prikhodko et al. |
| 7,817,966 | B2 | 10/2010 | Prikhodko et al. |
| 7,868,683 | B2 | 1/2011 | Ilkov |
| 7,868,697 | B2 * | 1/2011 | Arai ..................... 330/301 |
| 7,961,052 | B2 | 6/2011 | Bacon et al. |
| 8,093,945 | B2 | 1/2012 | Wimpenny |
| 8,106,711 | B2 | 1/2012 | Adamski et al. |
| 8,111,104 | B2 | 2/2012 | Ahadian et al. |
| 8,131,225 | B2 | 3/2012 | Botula et al. |
| 8,131,251 | B2 | 3/2012 | Burgener et al. |
| 8,232,627 | B2 | 7/2012 | Bryant et al. |
| 8,350,624 | B2 | 1/2013 | Lam |
| 8,368,462 | B2 | 2/2013 | Sharma et al. |
| 8,373,490 | B2 | 2/2013 | Burgener et al. |
| 2003/0090313 | A1 | 5/2003 | Burgener et al. |
| 2003/0224743 | A1 | 12/2003 | Okada et al. |
| 2004/0121745 | A1 | 6/2004 | Meck |
| 2007/0018718 | A1 | 1/2007 | Homg et al. |
| 2007/0243849 | A1 | 10/2007 | Prikhodko et al. |
| 2012/0007679 | A1 | 1/2012 | Burgener et al. |
| 2012/0086512 | A1 | 4/2012 | Sharma et al. |
| 2012/0194274 | A1 | 8/2012 | Fowers et al. |

OTHER PUBLICATIONS

Sowlati, Tirdad, "A 2.4-GHz 0/18-um CMOS Self-Biased Cascode Power Amplifier", IEEE Journal or Solid-State Circuits, vol. 38, No. 8, Aug. 2003, pp. 1318-1324.

Ko, Sangwon, et al., "A Linearized Cascode CMOS Power Amplifier", Electrical and Computer Engineering Dept., Univ. of Florida, IEEE, 2006, 4 pgs.

Webster, D.R., et al., "Novel Circuit Synthesis Technique using Short Channel GaAs FETS Giving Reduced Intermodulation Distortion", Dept. of Electronic and Electrical Engineering, University College, London, IEEE 1995, pp. 1348-1351.

Webster, Danny, et al., "Control of Circuit Distortion by the Derivative Superposition Method", IEEE Microwave and Guided Wave Letter, vol. 6, No. 3, Mar. 1996, pp. 123-125.

Van Der Heijden, Mark, et al., "Theory and Design of an Ultra-Linear Square-Law Approximated LDMOS Power Amplifier in Class-AB Operation", IEEE Transactions on Microwave Theory and Techniques, vol. 50, No. 9, Sep. 2002, pp. 2176-2184.

Kim, Bonkee, et al., "A New Linearization Technique for MOSFET RF Amplifier using Multiple Gated Transistors", IEEE Micro. and Guided Wave Ltrs, V. 10, No. 9, Sep. 2000, 371-373.

Jeon, Moon-Suk, et al., "A New "Active" Predistortor with High Gain using Cascode-FET Structures", MO4D-4, 2002 IEEE Radio Frequency Integrated Circuits Symposium, p. 253-256.

Aoki, Ichiro, et al., "Fully Integrated CMOS Power Amplifier Design Using the Distributed Active-Transformer Architecture", IEEE Journal of Solid-State Circuits, vol. 37, No. 3, Mar. 2002, pp. 371-383.

McRory, John, et al., "Transformer Coupled Stacked FET Power Amplifiers", IEEE Journal of Solid-State Circuits, vol. 34, No. 2, Feb. 1999, pp. 157-161.

Ezzeddine, Amin, et al., "The High Voltage/High Power FET", MO1D-6, IEEE Radio Frequency Integrated Circuits Symposium, 2003, pp. 215-218.

Ding, Yongwang, et al., "A High-Efficiency CMOS +22-dBm Linear Power Amplifier", IEEE Journal of Solid-State Circuits, vol. 40, No. 9, Sep. 2005, pp. 1895-1900.

Nguyen, Hieu P., Notice of Allowance received from the USPTO dated Sep. 20, 2011 for related U.S. Appl. No. 12/590,839, 13 pgs.

Adamski, et al., Response filed in the USPTO dated Dec. 13, 2011 for related U.S. Appl. 13/008,711, 5 pgs.

Tran, Pablo N., Notice of Allowance received from the USPTO dated Oct. 6, 2011 for related U.S. Appl. No. 11/501,125, 11 pgs.

Choe, Henry, Notice of Allowance received from the USPTO dated Oct. 14, 2011 for related U.S. Appl. No. 12/799,910, 23 pgs.

Nguyen, Khanh V., Office Action received from the USPTO dated Nov. 4, 2011 for related U.S. Appl. No. 12/807,365, 14 pgs.

Nguyen, Hieu P., Notice of Allowance received from the USPTO dated Sep. 29, 2011 for related U.S. Appl. No. 12/657,727, 14 pgs.

Adamski, et al., Response filed in the USPTO dated Dec. 13, 2011 for related U.S. Appl. No. 13/008,711, 5 pgs.

Choe, Henry, Notice of Allowance received from the USPTO dated Jan. 10, 2012 for related U.S. Appl. No. 13/008,711, 10 pgs.

Tran, Pablo N., Office Action received from the USPTO dated Feb. 3, 2012 for related U.S. Appl. No. 12/903,848, 46 pgs.

Nguyen, Khanh V., Office Action received from the USPTO dated Apr. 5, 2012 for related U.S. Appl. No. 12/807,365, 10 pgs.

Ghilini, Marie, International Search Report and Written Opinion dated Apr. 16, 2012 for related U.S. Appl. No. PCT/US2011/057381, 11 pgs.

Choe, Henry, Notice of Allowance received from the USPTO dated Aug. 2, 2012 for related U.S. Appl. No. 13/008,711, 15 pgs.

Burgener, et al., Response filed in the USPTO dated Aug. 3, 2012 for related U.S. Appl. No. 12/903,848, 5 pgs.

Nguyen, Khanh V., Notice of Allowance received from the USPTO dated Sep. 6, 2012 for related U.S. Appl. No. 12/807,365, 13 pgs.

Nguyen, Patricia T., Notice of Allowance received from the USPTO dated Sep. 27, 2012 for related U.S. Appl. No. 12/924,907, 40 pgs.

Tran, Pablo N, Notice of Allowance received from the USPTO dated Oct. 26, 2012 for related U.S. Appl. No. 12/903,848, 14 pgs.

Tran, Pablo No., Office Action received from the USPTO dated Dec. 18, 2012 for related U.S. Appl. No. 13/412,463, 6 pgs.

Sharma, et al., Issue Fee Transmittal and Comments on Examiner's Statement of Reasons for Allowance dated Dec. 27, 2012 for related U.S. Appl. No. 12/924,907, 4 pgs.

Shifrin, Mitchell, et al., "Monolithic FET Structures for High-Power Control Component Applications" IEEE Transactions on Microwave Theory and Techniques, vol. 37, No. 12, Dec. 1989, pp. 2134-2141.

Nguyen, Hieu, Office Action received from the USPTO dated Jun. 10, 2011 for related U.S. Appl. No. 12/657,727, 12 pgs.

Aquilani, Dario, Communication pursuant to Article 94(3) EPC received from the EPO dated Jan. 21, 2013 for related appln. No. 05763216.8, 4 pgs.

Tran, Pablo, Notice of Allowance received from the USPTO dated Feb. 15, 2013 for related U.S. Appl. No. 12/903,848, 26 pgs.

Choe, Henry, Notice of Allowance received from USPTO dated Apr. 5, 2013 for related U.S. Appl. No. 13/008,711, 15 pgs.

Tran, Pablo N., Notice of Allowance received from USPTO dated May 16, 2013 for related U.S. Appl. No. 12/903,848, 101 pgs.

Tran, Pablo N., Response to Office Action filed in USPTO on May 20, 2013 for related U.S. Appl. No. 13/412,463, 6 pgs.

Tran, Pablo No., Notice of Allowance received from the USPTO dated Jun. 6, 2013 for related U.S. Appl. No. 13/412,463, 142 pgs.

* cited by examiner

STACKED LINEAR POWER AMPLIFIER WITH CAPACITOR FEEDBACK AND RESISTOR ISOLATION

BACKGROUND

1. Field

The present teachings relate to reduction of distortion in electrical circuits. More particularly, the present teachings relate to a stacked linear power amplifier having capacitor feedback and resistor isolation.

2. Description of Related Art

Power amplifiers (PA) convert low-power signals into signals having a larger power. The prior art is replete with different PA designs and techniques for amplifying power. For example, J. Jeong, S. Pornpromlikit, P. M. Asbeck, D. Kelly, "A 20 dBm Linear RF Power Amplifier Using Stacked Silicon-on-Sapphire MOSFETs, *IEEE Microwave and Wireless Components Letters*, Vol. 16, No. 12, December 2006, discloses a serially-connected power amplifier (PA). See FIG. 1 of the present application, wherein a triple-stacked FET PA is shown. Jeong is concerned with obtaining large voltage swings at the gate of each FET and does so by providing the two top FETs with a capacitive voltage divider comprising the gate-to-source capacitance Cgs of each FET and an external gate capacitance C2, C3. C2 and C3 are determined so that each FET has the same drain-to-source (Vds), gate-to-source (Vgs), and drain-to-gate (Vdg) voltage swing. Jeong describes such arrangement to be essential, so that each FET delivers its maximum available power.

U.S. Pat. No. 6,137,367 to Ezzedine describes high power high impedance microwave devices for power applications. FIGS. 2 and 3 of Ezzedine show serially-connected PAs. In both embodiments, the Vds of each FET is the same.

U.S. Pat. No. 6,496,074 to Sowlati describes a cascode bootstrapped analog power amplifier circuit. FIG. 1 of Sowlati shows serially-connected FETs 10 and 12. Column 3, lines 60-65 of Sowlati states that use of the largest possible supply voltage is possible when Vds of 10 and 12 is the same.

U.S. Pat. No. 7,071,786 to Inoue describes a cascode circuit and an integrated circuit comprising such cascode circuit. As described at column 16 lines 60-65 of Inoue, the Vds of each FET should be the same.

However, in all of the above prior art examples of PA design, maximum available power appears to be the main concern. Non-linearity is therefore not addressed or improved, as non-linearity of serially connected transistors is usually amplified when the input signal experiences phase shifts as it passes from stage to stage. Therefore, while the above-described power amplifiers deliver the maximum available power, the linearity of the amplifiers is unfortunately unacceptable for many modern communication standards.

In particular, in accordance with modern communication standards, power spillover of PAs into adjacent allocated frequency channels should be taken into account. Non-linearity of the PA components is one of the main causes of power spillover, because it generates harmonics of the center frequency and produces intermodulation distortion (IMD). Therefore, there is a need to reduce non-linearity of the PA components as much as possible.

SUMMARY

According to a first aspect, a power amplifier circuit is provided, comprising: a first field effect transistor, wherein i) an RF input signal terminal is adapted to be coupled to a gate electrode of the first field effect transistor and ii) a first DC control voltage input is adapted to be coupled to the gate electrode of the first field effect transistor; one or more additional serially connected field effect transistors serially connected among themselves and to the first field effect transistor, each having a source terminal connected to a drain terminal of a preceding field effect transistor, wherein one or more additional DC control voltage inputs are each coupled to respective gate electrodes of the one or more additional field effect transistors, an output of the power amplifier circuit being taken on a drain electrode of the last one of the one or more additional field effect transistors; and one or more capacitors, each coupled to a respective one of the one or more additional field effect transistors, wherein the first DC control voltage input, the one or more additional DC control voltage inputs and the one or more capacitors are selected to minimize generation of non-linearities of each field effect transistor of the power amplifier circuit and to maximize, through phase alignment, cancellation of distortions between the field effect transistors of the power amplifier circuit whereby, upon minimization of non-linearities and maximization of cancellation of distortions, at least two of the first field effect transistor and the one or more additional field effect transistors are biased with different drain-source voltages Vds and/or different gate-source voltages Vgs.

According to a second aspect, a power amplifier comprising a plurality of amplifying components connected in parallel is provided, each amplifying component comprising: a) a first field effect transistor wherein a first DC control voltage input is adapted to be coupled to a gate terminal of the first field effect transistor; b) one or more additional serially connected field effect transistors serially connected among themselves and to the first field effect transistor, each having a source terminal connected to a drain terminal of a preceding field effect transistor, wherein one or more additional DC control voltage inputs are each coupled to respective gate terminals of the one or more additional field effect transistors; and c) one or more capacitors, each coupled to a respective one of the one or more additional field effect transistor wherein i) an RF input signal terminal is adapted to be coupled to the gate terminal of the first field effect transistor of each amplifying component, thus providing the power amplifier with the same input to each amplifying component; ii) an output of the power amplifier is taken on the drain terminal of the last one of the one or more additional field effect transistors of each amplifying component, thus providing the power amplifier with the same output from each amplifying component; and iii) the first DC control voltage input, the one or more additional DC control voltage inputs and the one or more capacitors of at least one amplifying component are selected to minimize generation of non-linearities of each field effect transistor of the power amplifier circuit and to maximize, through phase alignment, cancellation of distortions between the field effect transistors of the power amplifier whereby, upon minimization of non-linearities and maximization of cancellation of distortions, at least two of the first field effect transistor and the one or more additional field effect transistors of the at least one amplifying component are biased with different drain-source voltages Vds and/or different gate-source voltages Vgs.

According to a third aspect, a method for controlling DC voltage inputs and capacitance values of a power amplifier is provided, comprising: providing a first field effect transistor, wherein i) an RF input signal terminal is adapted to be coupled to a gate electrode of the first field effect transistor and ii) a first DC control voltage input is adapted to be coupled to the gate electrode of the first field effect transistor; providing one or more additional serially connected field effect transistors serially connected among themselves and to the first field effect transistor, each having a source terminal connected to a drain terminal of a preceding field effect transistor, wherein one or more additional DC control voltage inputs are each coupled to respective gate electrodes of the one or more additional field effect transistors, an output of the power amplifier circuit being taken on a drain electrode of the last one of the one or more additional field effect transistors; providing one or more capacitors, each coupled to a respective one of the one or more additional field effect transistor; and controlling the first DC control voltage input, the one or more additional DC control voltage inputs and the one or more capacitors to minimize generation of non-linearities of each field effect transistor of the power amplifier circuit and to maximize, through phase alignment, cancellation of distortions between the field effect transistors of the power amplifier circuit whereby, upon minimization of non-linearities and maximization of cancellation of distortions, at least two of the first field effect transistor and the one or more additional field effect transistors are biased with different drain-source voltages Vds and/or gate-source voltages Vgs.

According to a fourth aspect, a method for controlling DC voltage inputs and capacitance values of a power amplifier is provided, comprising: a) providing a first field effect transistor, wherein a first DC control voltage input is adapted to be coupled to a gate terminal of the first field effect transistor; b) providing one or more additional serially connected field effect transistors serially connected among themselves and to the first field effect transistor, each having a source terminal connected to a drain terminal of a preceding field effect transistor, wherein one or more additional DC control voltage inputs are each coupled to respective gate terminals of the one or more additional field effect transistors; and c) providing one or more capacitors, each coupled to a respective one of the one or more additional field effect transistor, wherein: i) an RF input signal terminal is adapted to be coupled to the gate terminal of the first field effect transistor of each amplifying component, thus providing the power amplifier with the same input to each amplifying component; and ii) an output of the power amplifier is taken on the drain terminal of the last one of the one or more additional field effect transistors of each amplifying component, thus providing the power amplifier with the same output from each amplifying component, the method further comprising d) controlling the first DC control voltage input, the one or more additional DC control voltage inputs and the one or more capacitors of at least one amplifying component to minimize generation of non-linearities of each field effect transistor of the power amplifier circuit and to maximize, through phase alignment, cancellation of distortions between the field effect transistors of the power amplifier whereby, upon minimization of non-linearities and maximization of cancellation of distortions, at least two of the first field effect transistor and the one or more additional field effect transistors of the at least one amplifying component are biased with different drain-source voltages Vds and/or gate-source voltages Vgs.

According to a fifth aspect, a system for improving linearity of an electronic circuit is provided, comprising: a sensor; a bias adjustment arrangement coupled to the sensor; a bias generator coupled to the bias adjustment arrangement; and an electronic circuit coupled to the bias generator, the power amplifier adapted to receive an input signal and to provide an output signal to a load, wherein the bias adjustment arrangement controls bias values to be generated by the bias generator and fed to the electronic circuit by reducing non-linearity of the output signal of the electronic circuit through action on parameters on which the non-linearity of the output signal depends.

According to a sixth aspect, a system for improving linearity of a power amplifier is provided, comprising: a sensor; a bias adjustment arrangement coupled to the sensor; a bias generator coupled to the bias adjustment arrangement; and a power amplifier coupled to the bias generator, the power amplifier adapted to receive an input signal and to provide an output signal to a load, wherein the bias adjustment arrangement controls bias values to be generated by the bias generator and fed to the power amplifier by reducing non-linearity of the output signal of the power amplifier through action on parameters on which the non-linearity of the output signal depends, and wherein the power amplifier comprises the power amplifier defined in the previous second aspect above.

BRIEF DESCRIPTION OF THE DRAWINGS

Like reference numbers and designations in the various drawings indicate like elements.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

According to a first embodiment of the present teachings, a serially-connected PA is provided, comprising several transistors stacked one above the other, forming an input stage and one or more additional stages stacked above the input stage, wherein: 1) the input voltage bias of the input stage and the one or more additional stages; and 2) the external gate capacitances of the one or more additional stages are configured to reduce distortion among stages. According to this embodiment, configuration of the input voltage bias of the input stage and additional stages allows minimization of the generation of non-linearities from each device. On the other hand, configuration of the external gate capacitances of the one or more additional stages allows phase alignment between devices to maximize cancellation of distortion between such devices. By way of example and not of limitation, reduction of distortion among stages can be performed by minimizing intermodulation distortion (IMD) of the PA In particular, the N-th order (N being an integer >=3) IMD of the PA can be minimized. One such embodiment is shown, for example, in the circuit schematic of FIG. 2. As noted above, IMD occurs when the non-linearity of a device or system causes undesired outputs at other frequencies. In a communications system, this means that signals in one channel can cause interference with other channels. Measure of the N-th order IMD can be obtained by calculating the N-th order intermodulation distortion ratio, which represents the ratio between the carrier power and the N-th order intermodulation power.

As mentioned above, reduction of distortion among stages can occur through IMD minimization. Non-linearities can also be measured through harmonic generation, adjacent channel power generation or spill over, error vector generation, and so on. Therefore, the above teachings can also be extended to different metrics of non-linearity.

Figure 1:
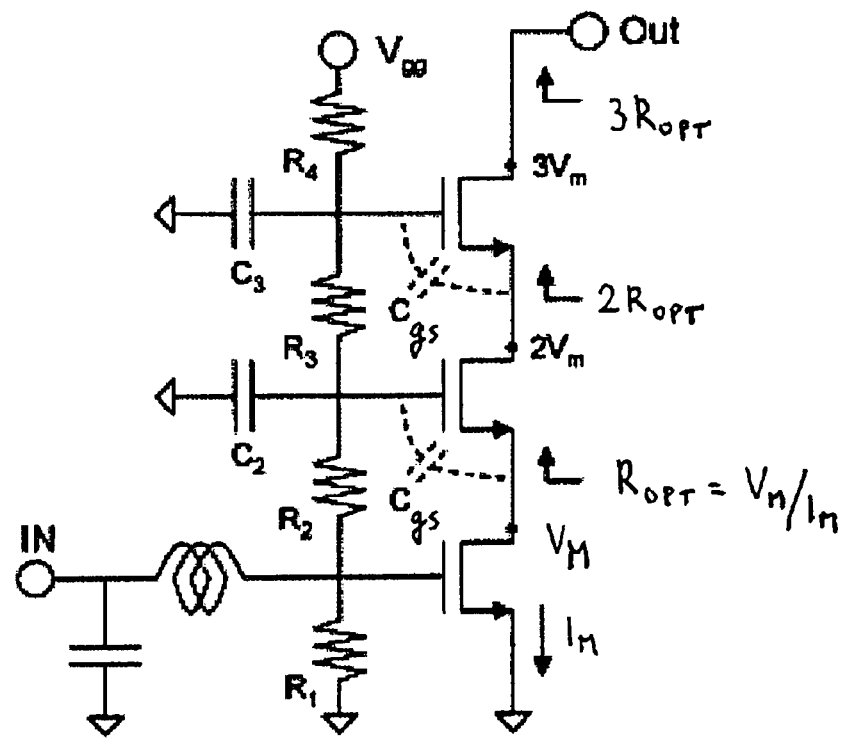
FIG. 1 is a circuit schematic showing a prior art arrangement of a power amplifier.
Figure 2:
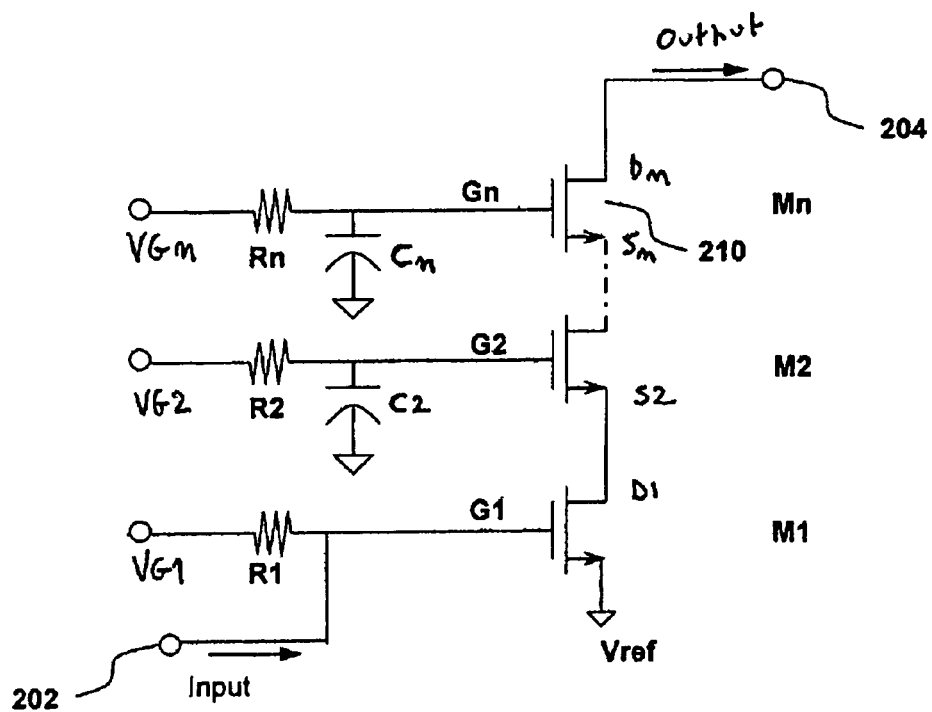
FIG. 2 is a circuit schematic showing an embodiment of the present teachings.

As shown in FIG. 2, an RF power amplifier in accordance with this embodiment comprises multiple serial transistor stages M1, M2, ..., Mn (with n greater than or equal to 2) of amplifying transistors. The first amplifying transistor M1 includes a gate or gate electrode G1. An input signal (202) is introduced to transistor M1. A first DC gate bias VG1 is applied to gate G1 through a series resistor R1. The function of the series resistor is to provide RF isolation between the transistor M1 and the DC gate bias source (not shown). The drain or drain electrode D1 of M1 is coupled to the source or source electrode S2 of the second stage transistor M2. A second DC gate bias VG2 is applied to the gate G2 through a series resistor R2, the function of which is similar to the function of resistor R1. Other embodiments are also possible. For example, a series inductor could also be used, to present a high impedance at radio frequency (RF) and a low impedance or short at low frequency or DC. The second stage comprises a capacitor C2. The feedback capacitor C2 provides a shunt path to ground, thereby modifying the input impedance of transistor M2. In accordance with the embodiment shown in FIG. 2, the input impedance of M2 is modified in order to provide a phase shift that eliminates signal distortion introduced through the first stage amplification. Similarly, the input impedance of M3 (if present) is modified in order to provide a phase shift that eliminates signal distortion introduced through the second stage amplification, and so on. Therefore, modification of the input impedance of M2, M3, ..., Mn allows optimization of the phase relationship between devices. In other words, the phase alignment between devices maximizes cancellation of distortion between such devices.

The amplified signal may optionally be output on the drain of the transistor M2 after the second stage of amplification. However, as described below in more detail, an arbitrarily large number of additional stages may be implemented, as shown by the dotted lines between M2 and Mn. With reference to the n-th stage Mn, the source Sn is coupled to the drain of the previous stage Dn−1. A DC gate bias VGn is applied to the gate Gn through a series resistor Rn. The n-th stage comprises a capacitor Cn, which provides a shunt path to ground, thereby modifying the input impedance of transistor Mn. Also, in this case, the input impedance of Mn is modified in order to provide a phase shift that eliminates signal distortion introduced through the previous stage of amplification. Amplifier output (204) provides the amplified output signal.

According to an embodiment of the present disclosure, the series resistors R1 ... Rn are made sufficiently large so that the product between each resistance and the total gate capacitance Cgg equals a time constant (R1 or R2 or ... Rn)*(Cgg) that is typically about 5-10 times larger than the inverse of the carrier frequency of the RF signal to be amplified. For example, a typical value of the center frequency for GSM standards is 900 MHz. Cgg is the total input capacitance of the device, predominantly Cgs plus Cgd plus a smaller parasitic capacitance due to interconnect. In the region where the amplifier device is biased, Cgs>>Cgd, therefore Cgg≈Cgs. The typical value of Cgg for an amplifying transistor of gate length 0.25 um, width 10 mm and gate oxide thickness 50 Å is (0.25 um×10,000 um×8.85 E-18F/um×3.9)/0.05 um=1.72 pF. A typical value of the series isolation resistor R1, R2, ..., Rn is approximately 10 Kohms. This corresponds to a (R)×(Cgg) time constant of 1.72 E-8 seconds, or a frequency of 58.3 MHz. This is more than 10 times less than the 900 MHz center frequency and is therefore acceptable. The transistors M1 to Mn of the power amplifier of FIG. 2 may be similar in width. If the transistors are similar in width, resistors R1 to Rn may be approximately equal. However, if the transistors M1 ... Mn are not designed to be of equal width, then one skilled in the circuit design arts may easily compute the appropriate resistance for each transistor.

As described above, shunt or feedback capacitors C2, ..., Cn are selected in order to provide a phase shift that counterbalances unintentional phase shift of the amplified signal. This unintentional phase shift is introduced as the signal is passed from M1 to M2, M2 to M3, and so on, up to Mn, depending on the number of stages that are implemented. By adjusting the phase of each stage, the phases of the stages can be maintained synchronized in order to minimize non-linearities of the output signal.

As already mentioned above, intermodulation distortion (IMD) is minimized by phase adjustment. Non-linearities that cause IMD are inherently present in the devices used to manufacture power amplifiers. Non-linearity sources in transistors include transconductance ($g_m$), output resistance ($R_{ds}$), gate-to-source capacitance ($C_{gs}$) and gate-to-drain capacitance ($C_{gd}$). The presence of non-linearities can be analyzed by discerning the higher-order derivatives of these non-linearity sources. Second-order non-linearities are found from the second derivative of gm, $R_{ds}$, and $C_{gs}$. Third-order non-linearities are found from the third derivative of those quantities. A common technique for expressing non-linearities is the polynomial, or Taylor-series, expansion:

$$y=a_0+a_1x+a_2x^2+a_3x^3+\ldots$$

For example, the cubic term $a_3x^3$ represents the presence of third-order non-linearities due, for example, to IMD. It contains the terms $\cos(2\omega_1 t-\omega_2 t)$ and $\cos(2\omega_2 t-\omega_1 t)$. As is well-known in the power amplifier design art, these terms can produce undesired signals in adjacent channels that are difficult to filter out because of their proximity to the desired signal frequency.

Another technique for expressing non-linearities is the Volterra series. The Volterra series is used to capture the "memory effect" of devices such as capacitors and inductors.

Minimization of the n-th order IMD through action on the input voltages VG1, VG2, ..., VGn and the shunt or feedback capacitors C2, ..., Cn have the effect of altering the behavior of the transistor of stage 2 with respect to the transistor of stage 1, and so on up to stage n.

As already mentioned above, the present disclosure provides minimization of non-linearities by also minimizing generation of non-linearities from each device through selection of the input voltage bias VG1, VG2, ..., VGn for each stage.

As known and as described in the prior art references set forth above in the background section, the gate biases VG1, VG2, ..., VGn should be set so that the drain-source voltage (Vds) for each transistor should be kept as constant as possible on the transistors M1 to Mn. This is done in order to maximize the Pout of the PA, because maximum Pout is limited by the first transistor to reach maximum allowed Vds for that technology. In contrast, according to an embodiment of the present disclosure, it can be seen (see also the description with reference to FIG. 3) that controlling the gate bias VG1, VG2, . . . , and VGn to achieve different Vds for the transistors M1 to Mn may cause substantial reduction of non-linearities. This technique teaches away from the prior art designs including series-connected power amplifiers, which have the same Vds across the transistors. Therefore, in accordance with the teachings of the present disclosure, the power output will be more linear than the power output of prior art devices. Stated in different words, this means that for a given device size the present disclosure will permit that device to deliver a higher output power level while achieving the same level of non-linearity. This is especially useful in cases of radio systems having a fixed requirement (or an absolute specification) on the non-linearity with respect to the output power. Being able to operate a given device at a higher power level while meeting the same linearity requirement will usually result in a higher device efficiency. A further consequence of the teachings of the present disclosure is that the size of the output device will be reduced to achieve the same targeted output power as the prior art. As a consequence, both efficiency increase and die size reduction are obtained.

One specific numerical example of this embodiment is also shown, where a specific type of IMD, e.g., third order intermodulation distortion is minimized. See, for example, the circuital arrangements shown in FIGS. 3 and 4. The structure of the circuital arrangement shown in FIG. 3 is substantially identical to the structure of the arrangement of FIG. 2 and therefore is not described in more detail herein.

Figure 3:
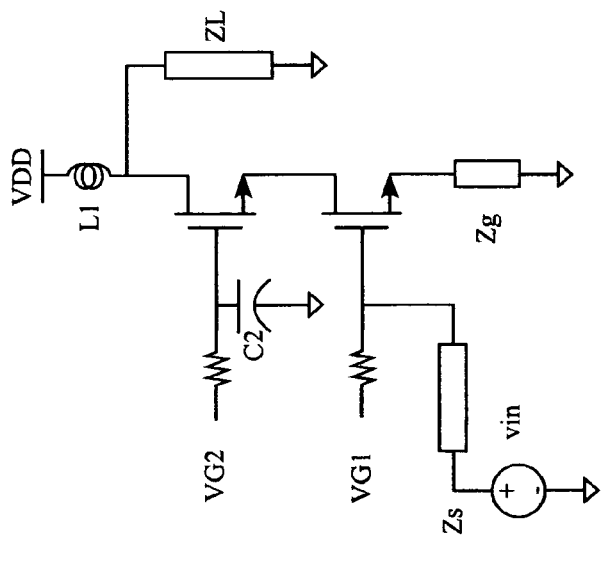
FIGS. 3 and 4 are circuit schematics showing an example of the embodiment of shown in FIG. 2.

According to this example, a third order intermodulation distortion for the 2-stack device of FIG. 3 is analyzed. Minimization of such distortion results in a configuration of voltage bias VG1, VG2 and voltage swing Vds1, Vds2 that differs from stage to stage. Stated in another manner, VG1 is different from VG2 and Vds1 is different from Vds2.

Similarly to what is described above, four distortion sources can be considered: gate-source capacitance $C_{gs}$, gate transconductance $g_m$, drain transconductance $g_{ds}$ and drain-gate capacitance $C_{gd}$. When a linear power amplifier works in the normal region, the drain-gate capacitance $C_{gd}$ can be neglected. Additionally, for a linear power amplifier, it is realistic to assume that the distortions are much smaller than the fundamental signal. Hence, a Volterra series can be used to analyze such distortions. Ignoring, for the purposes of this example, all cross modulations and higher order coefficients (>3), the gate transconductance $g_m$, drain transconductance $g_{ds}$, and gate-source capacitance $C_{gs}$ can be expanded as follows:

$$g_{mx} = g_{mx\_1} + g_{mx\_2} v_{gsx} + g_{mx\_3} v_{gsx}^2$$

$$g_{dsx} = g_{dsx\_1} + g_{dsx\_2} v_{dsx} + g_{dsx\_3} v_{dsx}^2$$

$$C_{gsx} = C_{gsx\_1} + C_{gsx\_2} v_{gsx} + C_{gsx\_3} v_{gsx}^2$$

$$x = 1, 2$$

The subscript "1" in the equations refers to the first stage of the circuit shown in FIG. 3, while the subscript "2" in these equations refers to the second stage of the circuit of FIG. 3. Therefore, the equations set forth above should be viewed as actually comprising six different equations. The above non-linear components may be replaced by linear components and corresponding distortion current source. The linearized model is shown in circuit of FIG. 4.

In the following analysis the intermodulation distortion is defined in relation to the fundamental signal. The term IM3R is used and it is defined as the ratio of the distorted signal to the fundamental signal.

When $$C_{gd} \ll C_{gs}, \; C_{ds} \ll C_{gs} \; r_{ds} \gg \frac{1}{g_m} \text{ and } z_g \ll \frac{1}{g_m},$$

the third order intermodulation distortion (IM3R) is given by the following equation:

$$IM3R_{2\omega_1-\omega_2} = \frac{1}{v_{in}} \Big\{ Z_s i_{nC_{gs1}} + \frac{(i_{nC_{gs2}} - i_{ng_{ds1}} - i_{ng_{m1}})(1 + j(2\omega_1 - \omega_2)C_{gs1}Z_s)}{g_{m1}} + \frac{((2\omega_1 - \omega_2)^2 C_{gs1} C_{gs2} Z_s - jC_{gs2}(2\omega_1 - \omega_2))(i_{ng_{ds2}} + i_{ng_{m2}})}{g_{m1} g_{m2}} \Big\}$$

If $$\left|\frac{\omega_1 - \omega_2}{\omega_1 + \omega_2}\right| \ll 1,$$

the relative impedances are similar across the narrow frequency range of $\omega_1$, $\omega_2$, $$\omega_0 = \frac{\omega_1 + \omega_2}{2},$$

and the 2nd harmonics are shorted on the input and output ports, IM3R becomes $$IM3R = \frac{1}{v_{gs1}} \Big\{ \frac{Z_s i_{nC_{gs1}}}{1 + j\omega_0 C_{gs1} Z_s} + \frac{i_{nC_{gs2}} - i_{ng_{ds1}} - i_{ng_{m1}}}{g_{m1}} - \frac{j\omega_0 C_{gs2}(i_{ng_{ds2}} + i_{ng_{m2}})}{g_{m1} g_{m2}} \Big\} \quad \text{(Eq. 1)}$$

Where $$i_{nC_{gsx}} = j\omega_0 \frac{3}{4} C_{gsx\_3} |v_{gsx}|^2 v_{gsx} \quad \text{(Eq. 2)}$$

$$i_{ng_{dsx}} = \frac{3}{4} g_{dsx\_3} |v_{dsx}|^2 v_{dsx} \quad \text{(Eq. 3)}$$

$$i_{ng_{mx}} = \frac{3}{4} g_{mx\_3} |v_{gsx}|^2 v_{gsx} \quad \text{(Eq. 4)}$$

$$x = 1, 2$$

Since the distortions are much smaller than the fundamental signal for linear amplifiers, $v_{gs1}$, $v_{ds1}$, $v_{gs2}$ and $v_{ds2}$ can be solved from KCL equations at the fundamental frequency $\omega_0$. When $C_{gd} \ll C_{gs}$, $C_{ds} \ll C_{gs}$, $$r_{ds} \gg \frac{1}{g_m}$$

and $f_0 \ll f_T$, we have:

$$V_{gs1} \approx -\frac{(g_{m2} + jw_0 C_{gs2})V_{in}}{g_{m2} + 2g_{m1}g_{m2}Z_g + jw_0 C_{gs2} + jw_0 C_{gs2}g_{m1}Z_g +} \quad \text{(Eq. 5)}$$
$$jw_0 C_{gs1}g_{m2}Z_g + jw_0 C_{gs1}g_{m2}Z_s -$$
$$w_0^2 C_{gs1}C_{gs2}Z_g - w_0^2 C_{gs1}C_{gs2}Z_s$$

$$v_{gs2} \approx \frac{g_{m1}}{g_{m2}} v_{gs1}$$

$$v_{ds1} \approx -\frac{C_2 + C_{gs2}}{C_2} \frac{g_{m1}}{g_{m2}} v_{gs1} \quad \text{(Eq. 6)}$$

$$v_{ds2} \approx -k_2 g_{m1} Z_L v_{gs1} \quad \text{(Eq. 7)}$$

$$\text{Wherein: } k_2 = 1 - \frac{C_2 + C_{gs2}}{C_2 g_{m2} Z_L} \quad \text{(Eq. 8)}$$

Substituting Equations (2) to (7) into Equation (1) gives the following:

$$IM3R = \frac{jw_0 \frac{3}{4} C_{gs1\_3} |v_{gs1}|^2 Z_s}{1 + jw_0 C_{gs1} Z_s} + \frac{jw_0 \frac{3}{4} C_{gsx\_3} |v_{gs2}|^2}{g_{m2}} +$$
$$\frac{\frac{3}{4} g_{ds1\_3} |v_{ds1}|^2 \left(\frac{C_2 + C_{gs2}}{C_2}\right) \frac{g_{m1}}{g_{m2}} - \frac{3}{4} g_{m1\_3} |v_{gs1}|^2}{g_{m1}} +$$
$$\frac{jw_0 C_{gs2} \left(\frac{3}{4} g_{ds2\_3} |v_{ds3}|^2 k_2 Z_L - \frac{3}{4} g_{m2\_3} |v_{gs2}|^2 \frac{1}{g_{m2}}\right)}{g_{m2}}$$

If the input port is matched and Q is its quality factor, the imaginary and real parts of IM3R are given by the following equations:

$$\text{Re}(IM3R) = \quad \text{(Eq. 9)}$$
$$\frac{3}{4} \frac{C_{gs1\_3}}{C_{gs1}} |v_{gs1}|^2 + \frac{3}{4} \frac{g_{ds1\_3}}{g_{m2}} |v_{ds1}|^2 \frac{C_2 + C_{gs2}}{C_2} - \frac{3}{4} \frac{g_{m1\_3}}{g_{m1}} |v_{gs1}|^2$$

$$\text{Im}(IM3R) = \frac{3}{4Q} \frac{C_{gs1\_3}}{C_{gs1}} |v_{gs1}|^2 + \frac{C_{gs2}\omega_0}{g_{m2}} \left(\frac{3}{4} \frac{C_{gs2\_3}}{C_{gs2}} |v_{gs2}|^2 - \right. \quad \text{(Eq. 10)}$$
$$\left. \frac{3}{4} \frac{g_{m2\_3}}{g_{ds2}} |v_{gs2}|^2 + \frac{3}{4} \frac{g_{ds2\_3}}{g_{ds2}} |v_{gs2}|^2 k_2 Z_L g_{ds2}\right)$$

According to the example shown in these calculations, IM3R is minimized when its real and imaginary parts approach zero. Hence, the bias voltages VG1, VG2 and the feedback capacitance C2 should be selected to meet following two equations (11) and (12):

$$\frac{C_{gs1\_3}}{C_{gs1}} + \frac{g_{ds1\_3}}{g_{m1}} \left(\frac{g_{m1}}{g_{m2}} \frac{C_2 + C_{gs2}}{C_2}\right)^3 - \frac{g_{m1\_3}}{g_{m1}} = 0 \quad \text{(Eq. 11)}$$

$$\frac{1}{Q} \frac{C_{gs1\_3}}{C_{gs1}} + \frac{C_{gs2}\omega_0}{g_{m2}} \quad \text{(Eq. 12)}$$
$$\left(\frac{C_{gs2\_3}}{C_{gs2}} \left(\frac{g_{m1}}{g_{m2}}\right)^2 - \frac{g_{m2\_3}}{g_{m2}} \left(\frac{g_{m1}}{g_{m2}}\right)^2 + g_{ds2\_3}(k_2 Z_L)^3 g_{m1}^2\right) = 0$$

Figure 9:
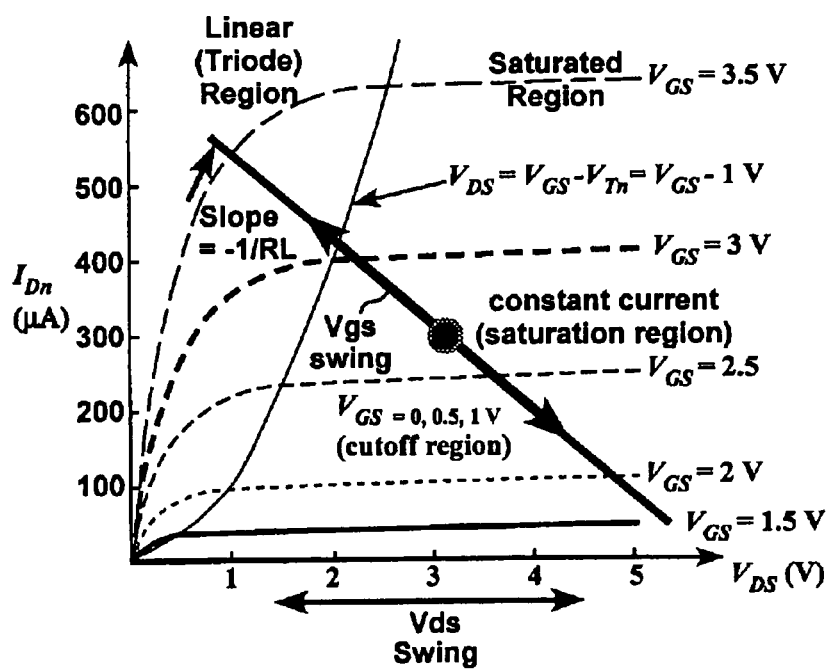
FIG. 9 shows a series of Vds vs. Id curves described in connection with some of the embodiments of the present disclosure.

Meanwhile, in order to maximize the linear output power, the swings of each stack can be scaled to align with their bias points, so that the transistors in each stack will enter the linear region operation simultaneously. Reference can be made, for example, to FIG. 9 of the present application, where Id curves as a function of Vds in accordance with different Vgs values are shown. FIG. 9 refers to a single device operation. As Vgs goes more positive, Vds drops to the point that the device crosses from the saturated region into a linear region. Many non-linearities are generated in the linear region. Therefore, according to this embodiment, all devices enter at the same point as Vgs is increased so that the non-linearity component of subsequent stages aligns with that of previous stages to permit cancellation.

The person skilled in the art of power amplifiers and device physics will understand that channel (drain) current Id is related to Vgs and Vds by the following generalized equations for the saturated and linear regions. Therefore, modifying the bias current also implies varying the effective Vgs and Vds. In some instances Id may be the parameter controlled, while in other cases Vgs and Vds may be the controlled parameters.

Saturated $$I_D = \frac{\mu_n C_{ox} W}{2L}(V_{GS} - V_T)^2(1 + \lambda V_{DS}) \quad \text{(Eq. 13)}$$

Linear Region $$Vds <= Vgs - Vt \quad \text{(Eq. 14)}$$
$$I_D = \frac{\mu_n C_{ox} W}{2L}(V_{GS} - V_T)^2$$

The person skilled in the art of power amplifiers will understand that peak power is just accessory to the teachings of the present disclosure, which are directed to either reaching a higher output power while holding IM3R (or IM3D) constant or obtaining a higher IM3R (or lower IM3D) at the same output power. As shown throughout the present disclosure, these effects are obtained by imposing conditions on the Ci, VGi, or both Ci and VGi of the equations where these variables are shown.

This restriction can be written as $$\frac{\frac{g_{m1}}{g_{m2}} + k_2 g_{m1} Z_L}{1 + \frac{C_2 + C_{gs2}}{C_2} \frac{g_{m1}}{g_{m2}}} = \frac{V_{DS2} - V_{GS2} + V_{th2}}{V_{DS1} - V_{GS1} + V_{th1}} \quad \text{(Eq. 15)}$$

$g_{m1}$, $C_{gs1}$, $g_{ds1\_3}$, $C_{gs1\_3}$, $g_{m1\_3}$ are a function of VG1 while $g_{m2}$, $C_{gs2}$, $g_{ds2\_3}$, $C_{gs2\_3}$, $g_{m2\_3}$ are a function of VG2. From the mathematical point view, there are three unknowns VG1, VG2 and $C_2$ that need to be optimized to meet the three equations (11), (12) and (15) set forth above. These equations can be solved by simulation software, such as MathCAD® or Mathematica®. It should be noted that if the two stacks are kept with equal configuration (i.e. Vds1=Vds2 and Vgs1=Vgs2), one freedom is lost and it becomes impossible to univocally solve the three equations, because the rank of the system falls to 2.

From the circuital point of view, the biasing point of the first stack can be tuned to allow cancellation of the real part of IM3R based on equation (11). If distortion items from the first stack cannot be canceled in the imaginary part of IM3R by simply tuning the biasing point of the first stack, a compensatory distortion coming from the second stack is to be introduced, based on equation (12). In other words, while first stack parameters (e.g., VG1) can be controlled to cancel the real part of IM3R, second stack parameters (e.g., VG2 and C2) can be controlled to cancel the imaginary part of IM3R.

Figure 4:
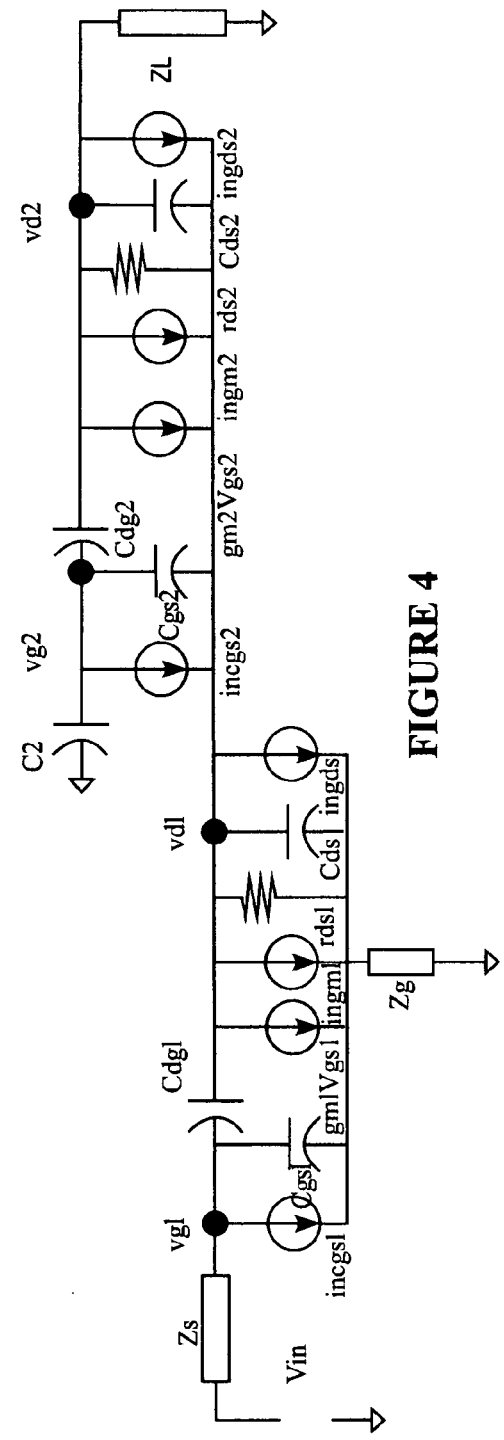

Therefore, in accordance with the examples shown in FIGS. 3 and 4, the stacked stages are designed unequally to allow distortion of one stage to cancel the distortion of the preceding stage.

Incidentally, it can be shown that the distortions cannot be canceled if the two stacks are operating in the same manner. In this case, Equations (11) and (12) become:

$$\text{Re}(IM3R) = \frac{C_{gs1\_3}}{C_{gs1}} + \frac{g_{ds1\_3}}{g_{m1}}\left(\frac{C_2 + C_{gs2}}{C_2}\right)^3 - \frac{g_{m1\_3}}{g_{m1}} = 0 \quad \text{(Eq. 16)}$$

$$\text{Im}(IM3R) = \quad \text{(Eq. 17)}$$
$$\frac{1}{Q}\frac{C_{gs1\_3}}{C_{gs1}} + \frac{C_{gs2}\omega_0}{g_{m1}}\left(\frac{C_{gs1\_3}}{C_{gs1}} - \frac{g_{m1\_3}}{g_{m1}} + \left(\frac{C_2 + C_{gs2}}{C_2}\right)^3\frac{g_{ds1\_3}}{g_{m1}}\right) =$$
$$\frac{1}{Q}\frac{C_{gs1\_3}}{C_{gs1}} + \frac{C_{gs2}\omega_0}{g_{m1}}(\text{Re}(IM3R)) = 0$$

It can be seen that equations (16) and (17) cannot be simultaneously true. Therefore, designing equally operating stacks have the consequence of increasing the IM3R when the input signal is increased.

Figure 5:
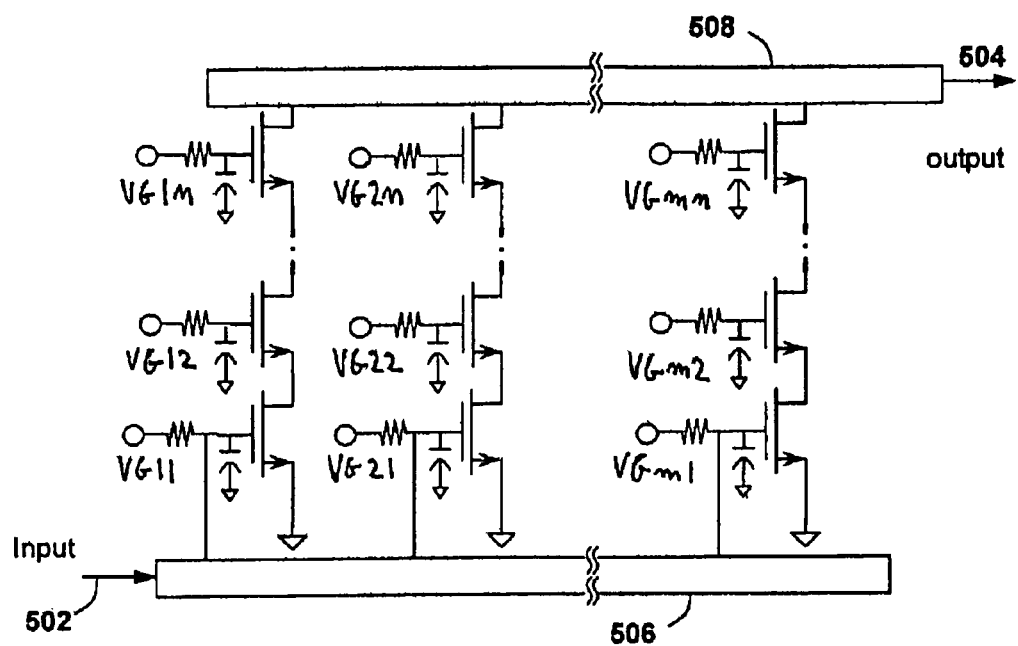
FIG. 5 is a circuit schematic showing a further embodiment of the present disclosure.

A further embodiment of the present disclosure is now described with reference to the circuit schematics of FIGS. 5 and 6.

According to this further embodiment, an arrangement comprising a plurality of serially-connected PAs, each structurally configured in a manner similar to the first embodiment, may be provided. One such possible structure is shown in FIG. 5. Such an arrangement may be seen as an n×m matrix arrangement, wherein each of the 1×m input stages has an independently selectable bias VG11, VG21, . . . , VGm1, and wherein each of the (n−1)×m additional stages has an independently selectable bias and an independently selectable external gate capacitance. The input signal (502) is common to each of the m input stages and the output signal (504) is common to each of the m output stages. Also, in this example, 1) the input voltage bias of the m input stages and the n×m additional stages and 2) the external gate capacitances of the n×m additional stages are configured to reduce IMD. In this second embodiment, reduced bias sensitivity may be obtained in addition to improved linearity. Also shown in FIG. 5 are a distributor or gate bus (506) and a combiner or drain bus (508), e.g. metallic buses, to minimize phase difference and resistive loss across the length of the bus. According to an embodiment of the present disclosure, buses (506) and (508) are wide metal traces, sometimes defined with multiple paths to assure electrical phase lengths are uniform from one individual device to another. Also, with this embodiment, one specific numerical example is shown, wherein IM3R is reduced in a two-column differential structure. See FIG. 6 for example.

Also in this example, four distortion sources are considered: gate-source capacitance $C_{gs}$, gate transconductance $g_m$, drain transconductance $g_{ds}$, and drain-gate capacitance $C_{dg}$. As described above, the drain-gate capacitance may be neglected and it will be assumed that distortions are much smaller than the fundamental signal. Ignoring all cross modulations and higher order coefficients (>5), the gate transconductance $g_m$, drain transconductance $g_{ds}$ and gate-source capacitance $C_{gs}$ may be expanded in a Volterra series as set forth as follows:

$$g_{mxy} = g_{mxy\_1} + g_{mxy\_2}v_{gsxy} + g_{mxy\_3}v_{gsxy}^2 + g_{mxy\_4}v_{gsxy}^3 + g_{mxy\_5}v_{gsxy}^4$$

$$g_{dsxy} = g_{dsxy\_1} + g_{dsxy\_2}v_{dsxy} + g_{dsxy\_3}v_{dsxy}^2 + g_{dsxy\_4}v_{dsxy}^3 + g_{dsxy\_5}v_{dsxy}^4$$

$$C_{gsxy} = C_{gsxy\_1} + C_{gsxy\_2}v_{gsxy} + C_{gsxy\_3}v_{gsxy}^2 + C_{gsxy\_4}v_{gsxy}^3 + C_{gsx\_5}v_{gsxy}^4$$

$x = 1,2; y = 1,2$

Replacing the nonlinear components of the above 12 equations with linear components and corresponding distortion current source, the third order intermodulation ratio (IM3R) may be obtained by solving KCL equations.

If $$\left|\frac{\omega_1 - \omega_2}{\omega_1 + \omega_2}\right| \ll 1, \; C_{gd} \ll C_{gs}, \; C_{ds} \ll C_{gs}$$

$$r_{ds} \gg \frac{1}{g_m}, \; Z_g \ll \frac{1}{g_m}, \; f_0 \ll f_T$$

and if all even harmonics are shorted in both the input and output ports, the imaginary and real parts of the third order intermodulation distortion ratio are expressed as follows:

$$\text{Re}(IM3R) =$$
$$\frac{1}{1 + \frac{g_{m12}}{g_{m11}}\frac{Z_{L2}}{Z_{L1}}\frac{Q_2}{Q_1}\frac{\alpha_2}{\alpha_1}\frac{\beta_2}{\beta_1}}\left\{\frac{3}{4}\frac{C_{gs11\_3}}{C_{gs11}}|v_{gs11}|^2 + \frac{25}{8}\frac{C_{gs11\_5}}{C_{gs11}}|v_{gs11}|^4 + \right.$$
$$\left(\frac{3}{4}\frac{g_{ds11\_3}}{g_{m21}}|v_{ds11}|^2 + \frac{25}{8}\frac{g_{ds11\_5}}{g_{m21}}|v_{ds11}|^4\right)\frac{C_{21} + C_{gs21}}{C_{21}} -$$
$$\left.\frac{3}{4}\frac{g_{m11\_3}}{g_{m11}}|v_{gs11}|^2 - \frac{25}{8}\frac{g_{m11\_5}}{g_{m11}}|v_{gs11}|^4\right\} +$$
$$\frac{1}{1 + \frac{g_{m11}}{g_{m12}}\frac{Z_{L1}}{Z_{L2}}\frac{Q_1}{Q_2}\frac{\alpha_1}{\alpha_2}\frac{\beta_1}{\beta_2}}\left\{\frac{3}{4}\frac{C_{gs12\_3}}{C_{gs12}}|v_{gs12}|^2 + \frac{25}{8}\frac{C_{gs12\_5}}{C_{gs12}}|v_{gs12}|^4 + \right.$$
$$\left(\frac{3}{4}\frac{g_{ds12\_3}}{g_{m22}}|v_{ds12}|^2 + \frac{25}{8}\frac{g_{ds12\_5}}{g_{m22}}|v_{ds12}|^4\right)\frac{C_{22} + C_{gs22}}{C_{22}} -$$
$$\left.\frac{3}{4}\frac{g_{m12\_3}}{g_{m12}}|v_{gs12}|^2 - \frac{25}{8}\frac{g_{m12\_5}}{g_{m12}}|v_{gs12}|^4\right\}$$

$$\text{Im}(IM3R) = \frac{1}{1 + \frac{g_{m12}}{g_{m11}}\frac{Z_{L2}}{Z_{L1}}\frac{Q_2}{Q_1}\frac{\alpha_2}{\alpha_1}\frac{\beta_2}{\beta_1}}$$
$$\left\{\frac{3}{4Q_1}\frac{C_{gs11\_3}}{C_{gs11}}|v_{gs11}|^2 + \frac{25}{8Q_1}\frac{C_{gs11\_5}}{C_{gs11}}|v_{gs11}|^4 + \right.$$
$$\frac{C_{gs21}\omega_0}{g_{m21}}\left(\frac{3}{4}\frac{C_{gs21\_3}}{C_{gs21}}|v_{gs21}|^2 + \frac{25}{8}\frac{C_{gs21\_5}}{C_{gs21}}|v_{gs21}|^4 - \right.$$
$$\frac{3}{4}\frac{g_{m21\_3}}{g_{m21}}|v_{gs21}|^2 - \frac{25}{8}\frac{g_{m21\_5}}{g_{m21}}|v_{gs21}|^4 +$$
$$\left.\left(\frac{3}{4}\frac{g_{ds21\_3}}{g_{ds21}}|v_{ds21}|^2 + \frac{25}{8}\frac{g_{ds21\_5}}{g_{ds21}}|v_{ds21}|^4\right)k_{21}Z_{L1}g_{ds21}\right)\right\} +$$
$$\frac{1}{1 + \frac{g_{m11}}{g_{m12}}\frac{Z_{L1}}{Z_{L2}}\frac{Q_1}{Q_2}\frac{\alpha_1}{\alpha_2}\frac{\beta_1}{\beta_2}}\left\{\frac{3}{4Q_2}\frac{C_{gs12\_3}}{C_{gs12}}|v_{gs12}|^2 + \frac{25}{8Q_2}\frac{C_{gs12\_5}}{C_{gs12}}|v_{gs12}|^4 + \right.$$
$$\frac{C_{gs22}\omega_0}{g_{m22}}\left(\frac{3}{4}\frac{C_{gs22\_3}}{C_{gs22}}|v_{gs22}|^2 + \frac{25}{8}\frac{C_{gs22\_5}}{C_{gs22}}|v_{gs22}|^4 - \right.$$
$$\frac{3}{4}\frac{g_{m22\_3}}{g_{m22}}|v_{gs22}|^2 - \frac{25}{8}\frac{g_{m22\_5}}{g_{m22}}|v_{gs22}|^4 +$$

-continued $$\left(\frac{3}{4}\frac{g_{ds22\_3}}{g_{ds22}}|v_{ds22}|^2 + \frac{25}{8}\frac{g_{ds22\_5}}{g_{ds22}}|v_{ds22}|^4\right)k_{22}Z_{L2}g_{ds22}\right\}$$

Wherein:

$$v_{gs2y} \approx \frac{g_{m1y}}{g_{m2y}}v_{gs1y}$$

$$v_{ds1y} \approx -\frac{C_{2y}+C_{gs2y}}{C_{2y}}\frac{g_{m1y}}{g_{m2y}}v_{gs1y}$$

$$v_{gs12} \approx \frac{Q_2\alpha_2}{Q_1\alpha_1}v_{gs11}$$

$$k_{1y} = \frac{C_{2y}+C_{gs2y}}{C_{2y}g_{m2y}Z_{Ly}}, k_{2y} = 1 - \frac{C_{2y}+C_{gs2y}}{C_2 g_{m2y}Z_{Ly}} \quad y = 1, 2$$

$$\omega_0 = \frac{\omega_1+\omega_2}{2}$$

$Z_{L1}$ and $Z_{L2}$ comprise the load impedances when looked from the drains of the top stacks;
$Q_1$ and $Q_2$ comprise input network quality factors when the input ports are conjugately matched;
$\alpha_1$ and $\alpha_2$ comprise the voltage division factors at the input; and
$\beta_1$ and $\beta_2$ comprise the voltage combination factors at the output.

To minimize IM3R, the imaginary and real parts of IM3R should be zero. These conditions can be set forth as follows:

$$RA1 + p\frac{g_{m12}}{g_{m11}} + RA2 + \frac{50|v_{gs11}|^2}{3}\left(RB1 + p\frac{g_{m12}}{g_{m11}}RB2\right) = 0 \quad \text{(Eq. 18)}$$

$$IA1 + p\frac{g_{m12}}{g_{m11}} + IA2 + \frac{50|v_{gs11}|^2}{3}\left(IB1 + p\frac{g_{m12}}{g_{m11}}IB2\right) = 0 \quad \text{(Eq. 19)}$$

Wherein $$p = \frac{Z_{L2}}{Z_{L1}}\left(\frac{Q_2}{Q_1}\right)^2\left(\frac{\alpha_2}{\alpha_1}\right)^2\frac{\beta_2}{\beta_1}$$

$$RA1 = \frac{C_{gs11\_3}}{C_{gs11}} + \frac{g_{ds11\_3}}{g_{m11}}\left(\frac{g_{m11}}{g_{m21}}\frac{C_{21}+C_{gs21}}{C_{21}}\right)^3 - \frac{g_{m11\_3}}{g_{m11}}$$

$$RA2 = \frac{C_{gs12\_3}}{C_{gs12}} + \frac{g_{ds12\_3}}{g_{m12}}\left(\frac{g_{m12}}{g_{m22}}\frac{C_{22}+C_{gs22}}{C_{22}}\right)^3 - \frac{g_{m12\_3}}{g_{m12}}$$

$$RB1 = \frac{C_{gs11\_5}}{C_{gs11}} + \frac{g_{ds11\_5}}{g_{m11}}\left(\frac{g_{m11}}{g_{m21}}\frac{C_{21}+C_{gs21}}{C_{21}}\right)^5 - \frac{g_{m11\_5}}{g_{m11}}$$

$$RB2 = \frac{C_{gs12\_5}}{C_{gs12}} + \frac{g_{ds12\_5}}{g_{m12}}\left(\frac{g_{m12}}{g_{m22}}\frac{C_{22}+C_{gs22}}{C_{22}}\right)^5 - \frac{g_{m12\_5}}{g_{m12}}$$

$$IA1 = \frac{1}{Q_1}\frac{C_{gs11\_3}}{C_{gs11}} + \frac{C_{gs21}\omega_0}{g_{m21}}\left(\frac{C_{gs21\_3}}{C_{gs21}}\left(\frac{g_{m11}}{g_{m21}}\right)^2 - \frac{g_{m21\_3}}{g_{m21}}\left(\frac{g_{m11}}{g_{m21}}\right)^2 + g_{ds21\_3}(k_{21}Z_{L1})^3 g_{m11}^2\right)$$

$$IA2 = \frac{1}{Q_2}\frac{C_{gs12\_3}}{C_{gs12}} + \frac{C_{gs22}\omega_0}{g_{m22}}\left(\frac{C_{gs22\_3}}{C_{gs22}}\left(\frac{g_{m12}}{g_{m22}}\right)^2 - \frac{g_{m22\_3}}{g_{m22}}\left(\frac{g_{m12}}{g_{m22}}\right)^2 + g_{ds22\_3}(k_{22}Z_{L2})^3 g_{m12}^2\right)$$

$$IB1 = \frac{1}{Q_1}\frac{C_{gs11\_5}}{C_{gs11}} + \frac{C_{gs21}\omega_0}{g_{m21}}$$

$$\left(\frac{C_{gs21\_5}}{C_{gs21}}\left(\frac{g_{m11}}{g_{m21}}\right)^4 - \frac{g_{m21\_5}}{g_{m21}}\left(\frac{g_{m11}}{g_{m21}}\right)^4 + g_{ds21\_5}(k_{21}Z_{L1})^5 g_{m11}^4\right)$$

$$IB2 = \frac{1}{Q_2}\frac{C_{gs12\_5}}{C_{gs12}} + \frac{C_{gs22}\omega_0}{g_{m22}}$$

$$\left(\frac{C_{gs22\_5}}{C_{gs22}}\left(\frac{g_{m12}}{g_{m22}}\right)^4 - \frac{g_{m22\_5}}{g_{m22}}\left(\frac{g_{m12}}{g_{m22}}\right)^4 + g_{ds22\_5}(k_{22}Z_{L2})^5 g_{m12}^4\right)$$

Also in this case, in order to maximize the linear output power, the swings of each stack can be scaled to align with their bias points. In other words, the intrinsic Vgs voltages for each device can be aligned to be identical across the voltage swing so that they enter into the linear region of operations simultaneously. Reference can be made, also in this case, to FIG. 9 of the present application. This restriction can be written as follows:

$$\frac{\frac{g_{m1y}}{g_{m2y}}+k_{2y}g_{m1}Z_{Ly}}{1+\frac{C_{2y}+C_{gs2y}}{C_{2y}}\frac{g_{m1y}}{g_{m2y}}} = \frac{V_{DS2y}-V_{GS2y}+V_{th2y}}{V_{DS1y}-V_{GS1y}+V_{th1y}}, \quad y=1,2 \quad \text{(Eq. 20)}$$

Figure 6:
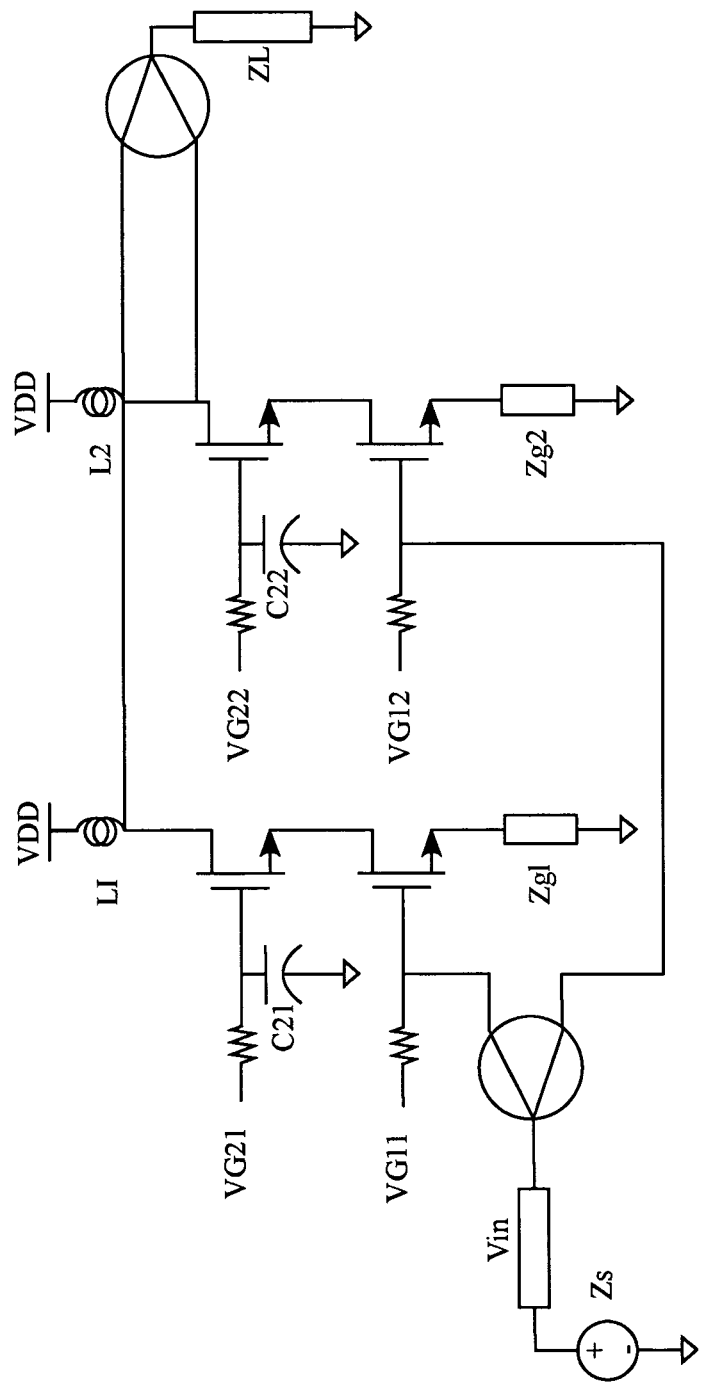
FIG. 6 is a circuit schematic showing an example of the embodiment shown in FIG. 5.

Three scenarios are now described in order to more fully present the benefits of the embodiment of the present disclosure shown in FIG. 6:

Case 1) This is a scenario wherein the input power is small so that the product between $$\frac{50|v_{gs11}|^2}{3}$$

and the fifth order coefficients is far smaller than the third order coefficients:

Hence, the equations (18) and (19) set forth above become:

$$RA1 + p\frac{g_{m12}}{g_{m11}}RA2 = 0 \quad \text{(Eq. 21)}$$

$$IA1 + p\frac{g_{m12}}{g_{m11}}IA2 = 0 \quad \text{(Eq. 22)}$$

In this scenario, even without the second column, it is also possible to tune the bias points VG11, VG21 in order to obtain the desired result of RA1=0, IA1=0. However, this is a problem of three unknowns for three independent equations. The optimal bias points should be one or few discrete points. In a real power amplifier, process, voltage and temperature (PVT) variation will get the bias away from optimal points. PVT sensing and bias adjustment can improve such disadvantage, but are limited by sensing sensitivity and accuracy.

On the other hand, if the parallel array of FIG. 6 is used, there are six unknowns to meet four independent equations (20), (21), (22). Therefore, RA1, IA1, RB2, IB2 do not have to be zero. For example, RA1, IA1 and RA2, IA2 can even be set to have opposite slope, so that IM3R can be very small over a bias region. In other words, the parallel array configuration of FIG. 6 can reduce bias sensitivity by absorbing PVT variations while still achieving a very low IMD3.

Case 2) This is a scenario wherein the input power has a value such that the product of $$\frac{50|v_{gs11}|^2}{3}$$

with the fifth order coefficients is negligible with respect to the third order coefficients.

To minimize the IM3R, equations (18) and (19) become:

$$RB1 + p\frac{g_{m12}}{g_{m11}}RB2 = 0 \quad \text{(Eq. 23)}$$

$$IB1 + p\frac{g_{m12}}{g_{m11}}IB2 = 0 \quad \text{(Eq. 24)}$$

$$RA1 + p\frac{g_{m12}}{g_{m11}}RA2 = 0 \quad \text{(Eq. 25)}$$

$$IA1 + p\frac{g_{m12}}{g_{m11}}IA2 = 0 \quad \text{(Eq. 26)}$$

In this scenario, there are six unknowns to meet six independent equations (20), (23), (24), (25) and (26). The parallel array of FIG. 6 can cancel distortion totally, but the bias may be sensitive to PVT variations. As described above with reference to case 1, PVT sensing and bias adjustment can provide improvement, but as described above, are limited by sensing sensitivity and accuracy.

If there is only one column, it would be impossible in this second case to cancel distortion over the entire input level.

Case 3) This is a scenario wherein the input power is so large that the $7^{th}$ order distortion cannot be ignored.

In this scenario, it can be expected that $|v_{gs11}|^4$ will appear in equations (18) and (19), so that there will be six unknowns to meet eight independent equations. The parallel array cannot cancel the distortion completely. In this scenario, the structure must be expanded to a three column array.

Another possible solution may be realized via input power sensing. For a fixed input power, distortions may be canceled with bias adjusting. IM3R will therefore show a notch at that input power. If bias points and caps are adjusted with input power, the IM3R can be maintained minimized. For example, by using a look up table that relates Pin to optimum Vgs and C settings, linearization can be optimized real time. Or, if output IM3D products can be sensed, then real time optimization or reduction of IM3D can be done through bias and capacitor adjustments in accordance with the teaching of the present disclosure. Of course, this technique is limited by the accuracy of input power sensing and tuning steps of bias voltage and capacitance values.

It can be seen that a differential structure is a special case of the embodiment shown in FIG. 6, when $\alpha_1$=0.5, $\alpha_2$=−0.5, $\beta_1$=0.5, $\beta_2$=−0.5. Because $$p = \frac{Z_{L2}}{Z_{L1}}\left(\frac{Q_2}{Q_1}\right)^2\left(\frac{\alpha_2}{\alpha_1}\right)^2\frac{\beta_2}{\beta_1},$$

it can be seen that its IM3R is equal with situation $\alpha_1$=0.5, $\alpha_2$=0.5, $\beta_1$=0.5, $\beta_2$=0.5. In other words, the differential structure can be biased asymmetrically to optimize linearity while reducing voltage swing over stacks. In other words, the differential structure reduces the Vpeak seen by the stack by a factor of 2. Combining the differential signals that are 180 degrees out of phase results in an output signal that is two times higher than the swing at the two separate devices stacks.

According to a further embodiment of the present disclosure, a system and method for improving linearity of a power amplifier are described. In particular, non-linearity of a power amplifier can depend on various factors and parameters that can change with manufacturing or the physical or electrical environment in which the power amplifier operates, such as temperature, amplitude of the input signal, phase of the input signal, frequency of the input signal, other attributes of the input signal, attributes of the output signal, attributes of the load, and so on.

Figure 7:
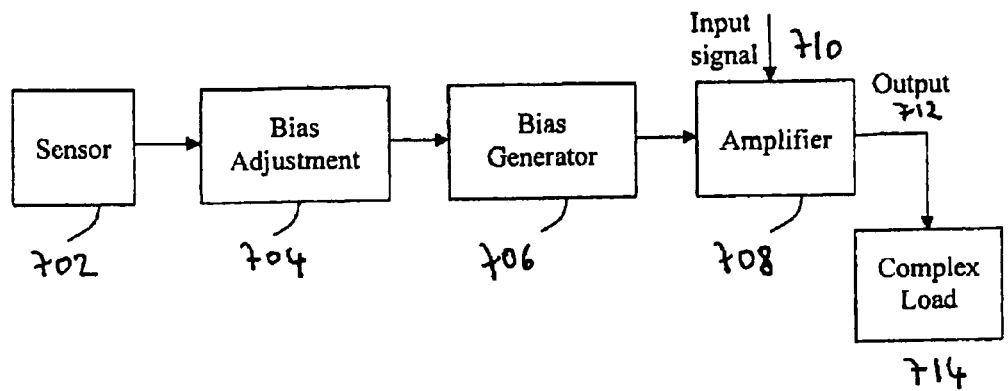
FIGS. 7 and 8 are block diagrams showing adaptive arrangements according to further embodiments of the present disclosure.

In accordance with such embodiment, FIG. 7 shows a block diagram of a system and method for improving linearity of a power amplifier. In particular, a system is shown that adapts the bias voltages to measured manufacturing, physical, and/or electrical conditions imposed on the circuit. As shown in FIG. 7, a sensor block (702) senses one or more of the above mentioned factors and parameters and feeds them to a bias adjustment block (704). The bias adjustment block (704) selects the appropriate bias control VG (reference can be made to previously described FIGS. 2 and 5) to be applied to the transistors M1 to Mn (FIG. 2) or M11 to Mmn (FIG. 5) to minimize non-linearity of the output signals (204) or (504). In particular, the bias adjustment block (704) is coupled to a bias generator block (706), which creates the required bias selected by the block (704), to be applied to the power amplifier. The bias generator block (706) is coupled to the power amplifier, schematically represented by way of a power amplifier block (708). The power amplifier (708) also receives an input signal (710), which corresponds, for example, to the input signal (202) in the embodiment of FIG. 2 and the input signal (502) shown in the embodiment of FIG. 5. The power amplifier (708) uses the biases supplied by the bias generator (706) as operating points for the transistors in the amplifier, which, in turn, produces an output (712). The output (712), which has improved linearity in accordance with the teachings described above, is applied to a complex load (714) (corresponding, for example, to the load $Z_L$ of FIGS. 3 and 6).

It is well known that manufacturing variations produce variations in transistor threshold voltages, resistances and capacitances. Variations in these quantities over time in a manufacturing line cause the operating point of the transistors to change, requiring the gate biases to be modified for a given device in order to maintain non-linearity at a minimum. One embodiment of sensor (702) can be a block that uses a device metric sensitive to manufacture tolerances, such as device threshold voltage Vt, to make adjustment to bias conditions within the power amplifier device. For example, as Vt drops, less gate voltage is needed to achieve the same bias current levels. A basic current mirror can be used to establish the correct Vgs for a targeted drain current Id using a reference device whose current is tightly monitored. As to the bias adjustment block (704), such a block may include, for example, lookup tables stored in memory which describe the bias settings VG1 . . . VGn or VG11 . . . VGmn required for a given non-linearity status. The bias adjustment block (704) may also include information on whether non-linearities are increasing or decreasing over time in order to iteratively achieve best non-linearity performance.

Figure 8:
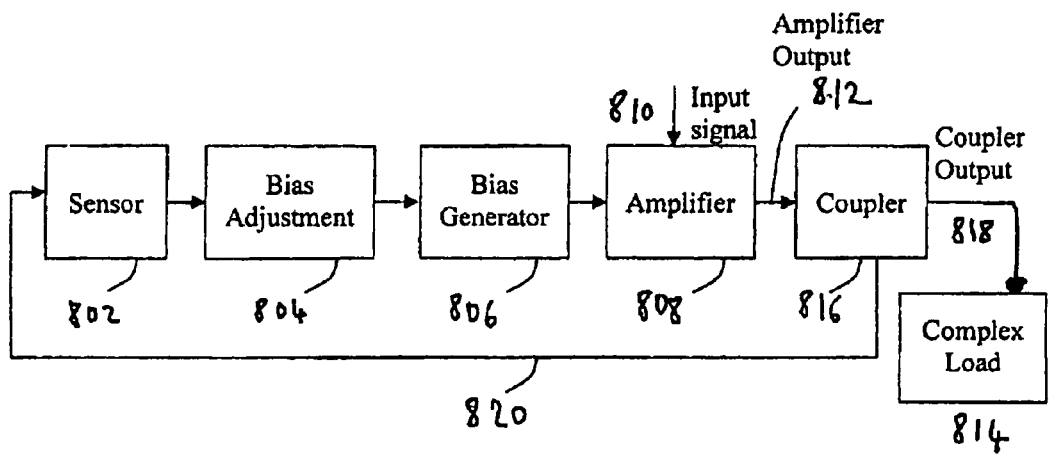

A further embodiment of an adaptive linearity improvement system is shown in the block diagram of FIG. 8, wherein feedback from the output is provided to the sensor block. In particular, as shown in FIG. 8, blocks (802), (804), (806), (808), (810), (812) and (814) correspond to respective blocks (702), (704), (706), (708), (710), (712) and (714) described above with reference to FIG. 7. In the embodiment shown in FIG. 8, an RF power coupler (816) is also included. The RF power coupler (816) diverts a small portion of the amplifier output (812) as a feedback signal (820). The feedback signal (820) is coupled to the sensor (802). The sensor (802), using techniques that are well known in the power amplifier design arts, such as directional coupler and power detector, measures the non-linearity content of the amplifier output (812) and allows adjustment of the bias values to be generated. The output (818) of the coupler (816) is provided to the load (814).

The circuital arrangements shown in the various figures can be realized by way of silicon on insulator (SOI) technology. The persons skilled in the power amplifier design arts will understand and appreciate that the field effect transistors may comprise FET, MOSFET (possibly realized with CMOS technology), MESFET, and other convenient technologies.

Accordingly, a stacked linear power amplifier and related devices, methods, and techniques have been described. While the stacked linear power amplifier has been described by means of specific embodiments and applications thereof, it is understood that numerous modifications and variations could be made thereto by those skilled in the art without departing from the spirit and scope of the disclosure. It is therefore to be understood that within the scope of the claims, the disclosure may be practiced otherwise than as specifically described herein.

A number of embodiments of the present inventive concept have been described. Nevertheless, it will be understood that various modifications may be made without departing from the scope of the inventive teachings. For example, it should be understood that 1) bias control (Vgs adjustment) and capacitance control (phasing) can be used together or separately, both in the embodiment of FIG. 2 and the embodiment of FIG. 5; Moreover, while examples have been provided where bias control is used to reduce non-linearity generation and capacitance control is used to adjust phasing (and thereby cancellation), the present disclosure is also intended to cover embodiments where bias affects phasing/cancellation by modifying the input impedance and the capacitance affects non-linearity generation; 2) Both the embodiment of FIG. 2 and the embodiment of FIG. 5 can be used to target linearities additional to or different from those shown above, like IMnD and nF0 harmonic frequencies; 3) active and passive sensing can be used; 4) Open and closed loop feedback systems can be used; 5) bias control and/or capacitance control can be applied also to other stacked devices where linearity is critical, such as mixers.

Accordingly, it is to be understood that the inventive concept is not to be limited by the specific illustrated embodiments, but only by the scope of the appended claims. The description may provide examples of similar features as are recited in the claims, but it should not be assumed that such similar features are identical to those in the claims unless such identity is essential to comprehend the scope of the claim. In some instances the intended distinction between claim features and description features is underscored by using slightly different terminology.

What is claimed is:

1. A power amplifier circuit comprising:
a first field effect transistor, wherein i) an RF input signal terminal is adapted to be coupled to a gate electrode of the first field effect transistor and ii) a first DC control voltage input is adapted to be coupled to the gate electrode of the first field effect transistor;
one or more additional serially connected field effect transistors serially connected among themselves and to the first field effect transistor, each having a source terminal connected to a drain terminal of a preceding field effect transistor, wherein one or more additional DC control voltage inputs are each coupled to respective gate electrodes of the one or more additional field effect transistors, an output of the power amplifier circuit being taken on a drain electrode of the last one of the one or more additional field effect transistors; and
one or more capacitors, each coupled to a respective one of the one or more additional field effect transistors,
wherein the first DC control voltage input, the one or more additional DC control voltage inputs and the one or more capacitors are selected to minimize generation of non-linearities of each field effect transistor of the power amplifier circuit and/or to maximize, through phase alignment, cancellation of distortions between the field effect transistors of the power amplifier circuit whereby, upon minimization of non-linearities and/or maximization of cancellation of distortions, at least two of the first field effect transistor and the one or more additional field effect transistors are biased with different drain-source voltages Vds, different gate-source voltages Vgs and/or different drain currents Id.

2. The power amplifier circuit of claim 1, wherein
the first DC control voltage input is coupled to the gate electrode of the first field effect transistor by a first resistor;
the one or more additional DC control voltage inputs are each coupled to the respective gate electrodes of the one or more additional field effect transistors by respective one or more additional resistors; and
the one or more capacitors are each coupled to the respective one of the one or more additional field effect transistors.

3. The power amplifier circuit of claim 2, wherein at least some of the one or more capacitors are coupled to the respective one of the one or more additional field effect transistors by the one or more additional resistors.

4. The power amplifier circuit of claim 2 or 3, wherein the first resistor and the one or more additional resistors are controllable to maximize the cancellation of distortions.

5. The power amplifier circuit of claim 1, wherein minimization of non-linearities and maximization of cancellation of distortions occurs through intermodulation distortion minimization.

6. The power amplifier circuit of claim 5, wherein intermodulation distortion minimization occurs by minimizing third or higher order intermodulation distortion of the power amplifier circuit.

7. The power amplifier circuit of claim 5, wherein intermodulation distortion minimization occurs by minimizing at least one between transconductance, output resistance, gate-to-source capacitance, and gate-to-drain capacitance of the power amplifier circuit.

8. The power amplifier circuit of claim 7, wherein the at least one between transconductance, output resistance, gate-to-source capacitance, and gate-to-drain capacitance is experimentally measured.

9. The power amplifier circuit of claim 1, wherein the first DC control voltage input and the one or more additional DC control voltage inputs are selected to minimize the generation of non-linearities and the one or more capacitors are selected to maximize the cancellation of the distortions.

10. The power amplifier of claim 1, wherein the first DC control voltage input and the one or more additional DC control voltage inputs are selected to maximize the cancellation of the distortions and the one or more capacitors are selected to minimize the generation of non-linearities.

11. The power amplifier circuit of claim 1, wherein the first DC control voltage input, the one or more additional DC control voltage inputs and the one or more capacitors are selected to jointly minimize the generation of non-linearities and jointly maximize the cancellation of the distortions.

12. A power amplifier comprising a plurality of amplifying components connected in parallel, each amplifying component comprising:
   a) a first field effect transistor wherein a first DC control voltage input is adapted to be coupled to a gate terminal of the first field effect transistor;
   b) one or more additional serially connected field effect transistors serially connected among themselves and to the first field effect transistor, each having a source terminal connected to a drain terminal of a preceding field effect transistor, wherein one or more additional DC control voltage inputs are each coupled to respective gate terminals of the one or more additional field effect transistors; and
   c) one or more capacitors, each coupled to a respective one of the one or more additional field effect transistor,
wherein
   i) an RF input signal terminal is adapted to be coupled to the gate terminal of the first field effect transistor of each amplifying component, thus providing the power amplifier with the same input to each amplifying component;
   ii) an output of the power amplifier is taken on the drain terminal of the last one of the one or more additional field effect transistors of each amplifying component, thus providing the power amplifier with the same output from each amplifying component; and
   iii) the first DC control voltage input, the one or more additional DC control voltage inputs and the one or more capacitors of at least one amplifying component are selected to minimize generation of non-linearities of each field effect transistor of the power amplifier circuit and/or to maximize, through phase alignment, cancellation of distortions between the field effect transistors of the power amplifier whereby, upon minimization of non-linearities and/or maximization of cancellation of distortions, at least two of the first field effect transistor and the one or more additional field effect transistors of the at least one amplifying component are biased with different drain-source voltages Vds, gate-source voltages Vgs and/or drain currents Id.

13. The power amplifier circuit of claim 12, wherein minimization of non-linearities and maximization of cancellation of distortions occurs through intermodulation distortion minimization.

14. The power amplifier circuit of claim 12, wherein the first DC control voltage input and the one or more additional DC control voltage inputs are selected to minimize the generation of non-linearities and the one or more capacitors are selected to maximize the cancellation of the distortions.

15. The power amplifier of claim 12, wherein the first DC control voltage input and the one or more additional DC control voltage inputs are selected to maximize the cancellation of the distortions and the one or more capacitors are selected to minimize the generation of non-linearities.

16. The power amplifier circuit of claim 12, wherein the first DC control voltage input, the one or more additional DC control voltage inputs and the one or more capacitors are selected to jointly minimize the generation of non-linearities and jointly maximize the cancellation of the distortions.

17. A method for controlling DC voltage inputs and capacitance values of a power amplifier, comprising:
   providing a first field effect transistor, wherein i) an RF input signal terminal is adapted to be coupled to a gate electrode of the first field effect transistor and ii) a first DC control voltage input is adapted to be coupled to the gate electrode of the first field effect transistor;
   providing one or more additional serially connected field effect transistors serially connected among themselves and to the first field effect transistor, each having a source terminal connected to a drain terminal of a preceding field effect transistor, wherein one or more additional DC control voltage inputs are each coupled to respective gate electrodes of the one or more additional field effect transistors, an output of the power amplifier circuit being taken on a drain electrode of the last one of the one or more additional field effect transistors;
   providing one or more capacitors, each coupled to a respective one of the one or more additional field effect transistor; and
   controlling the first DC control voltage input, the one or more additional DC control voltage inputs and the one or more capacitors to minimize generation of non-linearities of each field effect transistor of the power amplifier circuit and/or to maximize, through phase alignment, cancellation of distortions between the field effect transistors of the power amplifier circuit whereby, upon minimization of non-linearities and/or maximization of cancellation of distortions, at least two of the first field effect transistor and the one or more additional field effect transistors are biased with different drain-source voltages Vds, different gate-source voltages Vgs and/or different drain currents Id.

18. The method of claim 17, wherein minimization of non-linearities and maximization of cancellation of distortions occurs through intermodulation distortion minimization.

19. A method for controlling DC voltage inputs and capacitance values of a power amplifier, comprising:
   a) providing a first field effect transistor, wherein a first DC control voltage input is adapted to be coupled to a gate terminal of the first field effect transistor;
   b) providing one or more additional serially connected field effect transistors serially connected among themselves and to the first field effect transistor, each having a source terminal connected to a drain terminal of a preceding field effect transistor, wherein one or more additional DC control voltage inputs are each coupled to respective gate terminals of the one or more additional field effect transistors; and
   c) providing one or more capacitors, each coupled to a respective one of the one or more additional field effect transistor,
wherein:
   i) an RF input signal terminal is adapted to be coupled to the gate terminal of the first field effect transistor of each amplifying component, thus providing the power amplifier with the same input to each amplifying component; and
   ii) an output of the power amplifier is taken on the drain terminal of the last one of the one or more additional field effect transistors of each amplifying component, thus providing the power amplifier with the same output from each amplifying component, the method further comprising
   d) controlling the first DC control voltage input, the one or more additional DC control voltage inputs and the one or more capacitors of at least one amplifying component to minimize generation of non-linearities of each field effect transistor of the power amplifier circuit and/or to maximize, through phase alignment, cancellation of distortions between the field effect transistors of the power amplifier whereby, upon minimization of non-linearities and/or maximization of cancellation of distortions, at least two of the first field effect transistor and the one or more additional field effect transistors of the at least one amplifying component are biased with different drain-source voltages Vds, different gate-source voltages Vgs and/or different drain currents Id.

20. The method of claim 19, wherein minimization of non-linearities and maximization of cancellation of distortions occurs through intermodulation distortion minimization.

* * * * *